(12) United States Patent
Zhao

(10) Patent No.: US 11,195,881 B2
(45) Date of Patent: Dec. 7, 2021

(54) ARRAY SUBSTRATE AND FLEXIBLE DISPLAY PANEL

(71) Applicant: WUHAN CHINA STAR OPTOELECTRONICS SEMICONDUCTOR DISPLAY TECHNOLOGY CO., LTD., Wuhan (CN)

(72) Inventor: Jinrong Zhao, Wuhan (CN)

( * ) Notice: Subject to any disclaimer, the term of this patent is extended or adjusted under 35 U.S.C. 154(b) by 313 days.

(21) Appl. No.: 16/467,048

(22) PCT Filed: Feb. 21, 2019

(86) PCT No.: PCT/CN2019/075662
§ 371 (c)(1),
(2) Date: Jun. 6, 2019

(87) PCT Pub. No.: WO2020/124778
PCT Pub. Date: Jun. 25, 2020

(65) Prior Publication Data
US 2021/0242288 A1    Aug. 5, 2021

(30) Foreign Application Priority Data

Dec. 21, 2018 (CN) .......................... 201811574067.0

(51) Int. Cl.
*H01L 21/44* (2006.01)
*H01L 31/101* (2006.01)
*H01L 27/32* (2006.01)
*H01L 51/52* (2006.01)

(52) U.S. Cl.
CPC .......... *H01L 27/3218* (2013.01); *H01L 51/52* (2013.01); *H01L 2251/5338* (2013.01)

(58) Field of Classification Search
CPC ............. H01L 23/4985; H01L 23/5387; H01L 2251/5338; H01L 31/03926; H01L 51/0097
USPC .......... 438/117–119; 257/677, 688, 773, 786
See application file for complete search history.

(56) References Cited

U.S. PATENT DOCUMENTS

| | | | | |
|---|---|---|---|---|
| 9,153,636 B2* | 10/2015 | Tanaka | ................ | H01L 27/3253 |
| 10,269,890 B2* | 4/2019 | Cho | .................... | H01L 23/5283 |
| 10,270,047 B2* | 4/2019 | Chen | ................... | H01L 27/3204 |
| 10,361,385 B2* | 7/2019 | Choi | ....................... | H01L 51/56 |
| 10,553,666 B2* | 2/2020 | Kanaya | .............. | H01L 51/0097 |

* cited by examiner

*Primary Examiner* — Calvin Lee

(57) ABSTRACT

The present disclosure provides an array substrate and a flexible display panel. The array substrate includes a non-bending area, a bending area connecting the non-bending areas, a subpixel, a plurality of first spacers disposed on the bending area, and a plurality of second spacers disposed on the non-bending area. The subpixels distributed in arrays are distributed on the non-bending area and the bending area. The plurality of first spacers are correspondingly distributed on both sides of each of the subpixels. The present disclosure solves the subpixel failure caused by uneven distribution of subpixel stress in the related art.

8 Claims, 3 Drawing Sheets

ARRAY SUBSTRATE AND FLEXIBLE DISPLAY PANEL

CROSS-REFERENCE TO RELATED APPLICATIONS

This application is a U.S. National Phase application submitted under 35 U.S.C. § 371 of Patent Cooperation Treaty Application Serial No. PCT/CN2019/075662, filed on Feb. 21, 2019 which claims the priority of China Patent Application Serial No. 201811574067.0, filed on Dec. 21, 2018 the disclosures of which are incorporated herein by reference in their entirety.

BACKGROUND

1. Field of the Disclosure

The present disclosure relates to displays, and more particularly, to an array substrate and a flexible display panel.

2. Description of the Related Art

With the rapid development and popularization of electronic products equipped with flexible displays such as smartphones, wearable display devices, in-vehicle displays, augmented reality (AR), and virtual reality (VR), the market for small and medium-sized products shows a strong demand. Especially, the flexible organic light-emitting diode (OLED) technology represents new high-performance display technology and accelerates to enter the market of a smart terminal such as high-end smartphones and wearable devices with the unique performance advantages in display performance, thinness, and flexibility.

The flexible display can be flexibly bent, folded, stretched, and is extremely thin and light, small in size, low in power consumption, and high in portability so the flexible display can be applied to a wider range of fields. However, as to whether the flexible display can be launched on the market, the market and consumer acceptance still needs to be taken into consideration. Good user experience and reliability are also crucial. A foldable, stretchable, or bending flexible display is a technological innovation in the display industry.

The product needs to meet various reliability tests in the development of display folding. For example, after dynamic bending of the radius for 100,000 times and more, electrical properties, optical properties, mechanical properties, environmental reliability, the efficiency of an organic light-emitting diode (OLED), and packaged water-oxygen barrier properties do not change significantly and do not affect normal use of the user.

As illustrated in FIG. 1, a low temperature poly-silicon (LTPS) array substrate 1000 is of the stacked structure. The LTPS array substrate 1000 includes a substrate 1001, a barrier layer 1002, a buffer layer 1003, an active layer 1004, a first insulating layer 1005, a first gate layer 1006, a second insulating layer 1007, a second gate layer 1008, an interlayer dielectric layer 1009, a source/drain layer 1010, a planarization layer 1011, an electrode layer 1012, a pixel defining layer 1013, and a spacer 20. The spacer 20 is arranged on the pixel defining layer 1013 and is configured to support the evaporation mask during OLED evaporation to avoid hurting the OLED device in a subpixel 30. The spacer 20 of the related art is shaped like a trapezoid and formed by photolithography.

As illustrated in FIG. 2, the spacers 20 of the related art are uniformly distributed in the bending area and the non-bending area, and every eight of the subpixels 30 includes a spacer 20. The density of the spacer 20 in distribution is the same as the pattern of the spacer 20. As illustrated in FIG. 3, the spacer 20 is disposed on both sides of some of the subpixels 30 only when the array substrate 1000 is bent. The spacers 20 are asymmetrically distributed. So the stress produced when the array substrate is bent cannot be evenly distributed, which causes the stress to be greatly concentrated on one of the subpixels 30 and causes the subpixel 30 to be ineffective.

SUMMARY

An object of the present disclosure is to provide an array substrate and a flexible display panel to deal with the problem in the prior art that only one spacer is disposed on both sides of some subpixels when the array substrate is bent. The spacers are distributed asymmetrically so that the stress produced when the array substrate is bent cannot be evenly distributed, which causes the stress to be greatly concentrated on one of the subpixels and causes the subpixel to be ineffective.

The present disclosure provides an array substrate includes a non-bending area, a bending area connecting the non-bending areas, a subpixel, a plurality of first spacers disposed on the bending area, and a plurality of second spacers disposed on the non-bending area. The subpixels distributed in arrays are distributed on the non-bending area and the bending area. The plurality of first spacers are correspondingly distributed on both sides of each of the subpixels.

Furthermore, the subpixels comprise red subpixels, blue subpixels, and green subpixels. The green subpixels are correspondingly arranged in a plurality of columns. The red subpixels and the blue subpixels are correspondingly arranged in a plurality of columns at intervals.

Furthermore, a center line of each of the red subpixels and the adjacent blue subpixel comprises a vertical bisector. The center of one of the green subpixels is on the vertical bisector.

Furthermore, a bending centerline is disposed on the bending area. One or more of the first spacers are disposed on both sides of each of the subpixels in a direction perpendicular to the bending center line.

Furthermore, the first spacer is arranged between one of the red subpixels and one of the blue subpixels.

Furthermore, the first spacer is shaped like a step or a valley. The first spacer comprises a first spacer and a second spacer. The height of the first spacer is less than the height of the second spacer. The first spacer faces the subpixel corresponding thereto.

Furthermore, one of the second spacers is disposed between every eight of the subpixels in the non-bending area.

Furthermore, the width of the bending area is $2\pi$ (times the bending radius when the array substrate is arranged flat.

Furthermore, material for the first spacer and the second spacer is an organic photoresist.

The present disclosure also provides a flexible display panel comprising an array substrate as provided above.

The advantage of the array substrate proposed by the present disclosure is as follows. A spacer is added in the bending area by increasing the density of the spacers in distribution. When the array substrate is bent, the spacer can evenly distribute the stress produced while the film layers of the device are dynamically bent, thereby protecting the devices in the array substrate and effectively avoiding the subpixel failure caused by uneven distribution of subpixel stress in the related art. In addition, the service life of the array substrate is prolonged, and the reliability of the display device is ensured. Overall, the requirement for the reliability of the product is fulfilled. Moreover, no additional masks are needed in the present disclosure as long as the spacer mask of the related art is redesigned, which saves resources and reduces costs obviously. The flexible display panel proposed by the present disclosure has a long service life and excellent image quality on display.

Figure 1:
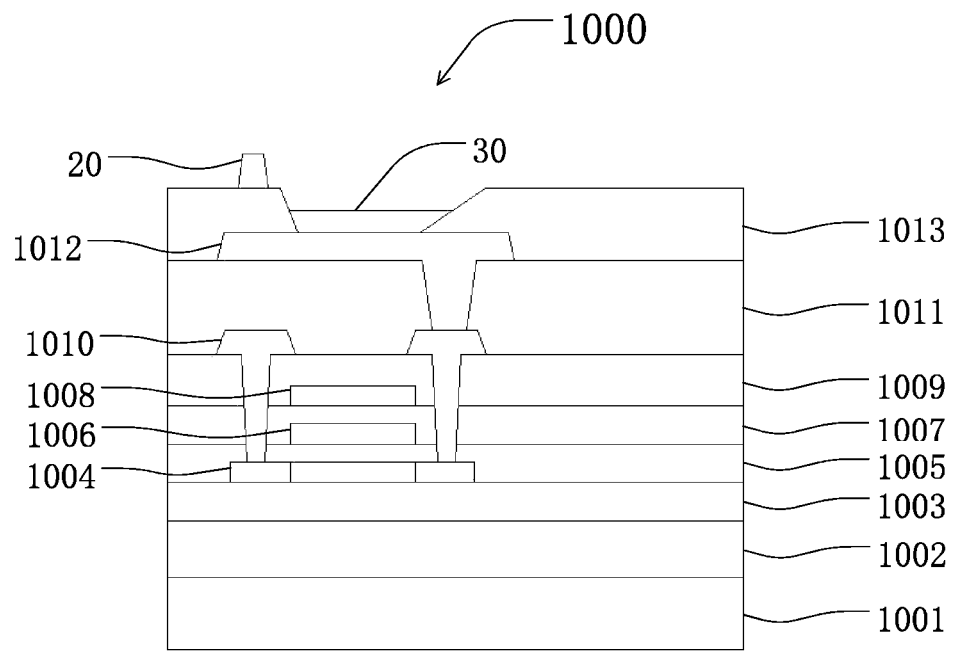
FIG. 1 illustrates a schematic diagram of a conventional low temperature poly-silicon (LTPS) array substrate.
Figure 2:
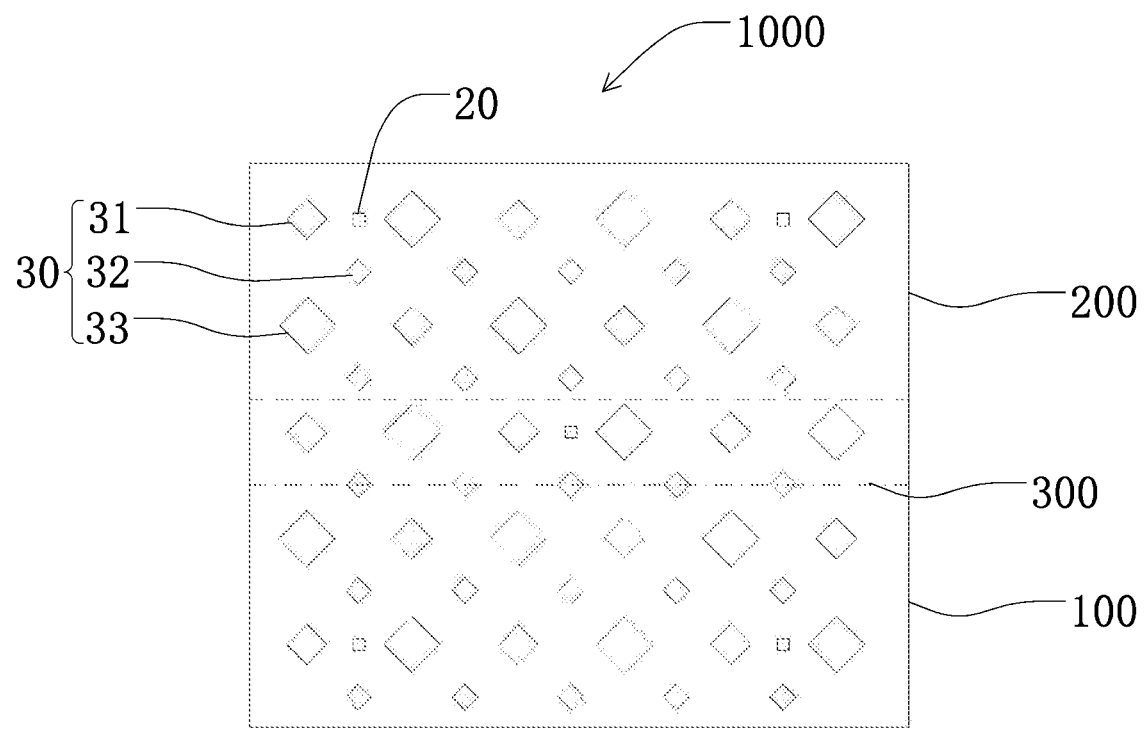
FIG. 2 illustrates spacers uniformly distributed on an array substrate.
Figure 3:
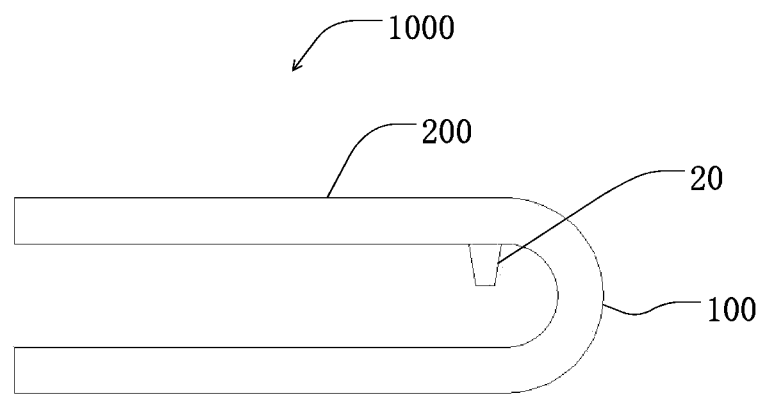
FIG. 3 illustrates a bent array substrate according to a related art.

Reference Sign of Elements Illustrated Drawings are Listed as Follows:

| | | | |
|---|---|---|---|
| array substrate | 1000; | | |
| non-bending area | 100; | non-bending area | 200; |
| bending centerline | 300; | first spacer | 10; |
| second spacer | 20; | subpixel | 30; |
| red subpixel | 31; | blue subpixel | 32; |
| green subpixel | 33; | | |
| substrate | 1001; | barrier layer | 1002; |
| buffer layer | 1003; | active layer | 1004; |
| first insulating layer | 1005; | first gate layer | 1006; |
| second insulating layer | 1007; | second gate layer | 1008; |
| interlayer dielectric layer | 1009; | source/drain layer | 1010; |
| planarization layer | 1011; | electrode layer | 1012; |
| pixel defining layer | 1013. | | |

DETAILED DESCRIPTION OF THE EMBODIMENTS

Embodiments of the present application are illustrated in detail in the accompanying drawings, in which like or similar reference numerals refer to like or similar elements or elements having the same or similar functions throughout the specification. The embodiments described below with reference to the accompanying drawings are exemplary and are intended to be illustrative of the present application, and are not to be construed as limiting the scope of the present application.

The invention is described below in detail with reference to the accompanying drawings, wherein like reference numerals are used to identify like elements illustrated in one or more of the figures thereof, and in which exemplary embodiments of the invention are shown. This invention may, however, be embodied in many different forms and should not be construed as limited to the particular embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It is understood that terminologies, such as "top," "bottom," "front," "back," "left," "right," "inner," and "outer," are locations and positions regarding the figures. These terms merely facilitate and simplify descriptions of the embodiments instead of indicating or implying the device or components to be arranged on specified locations, to have specific positional structures and operations. These terms shall not be construed in an ideal or excessively formal meaning unless it is clearly defined in the present specification. In addition, the term "first", "second," and "third" are for illustrative purposes only and are not to be construed as indicating or imposing a relative importance or implicitly indicating the number of technical features indicated. Thus, a feature that limited by "first", "second," and "third" may expressly or implicitly include at least one of the features.

All of the terminologies containing one or more technical or scientific terminologies have the same meanings that persons skilled in the art understand ordinarily unless they are not defined otherwise. For example, "upper" or "lower" of a first characteristic and a second characteristic may include a direct touch between the first and second characteristics. The first and second characteristics are not directly touched; instead, the first and second characteristics are touched via other characteristics between the first and second characteristics. All of the terminologies containing one or more technical or scientific terminologies have the same meanings that persons skilled in the art understand ordinarily unless they are not defined otherwise. For example, "arrange," "couple," and "connect," should be understood generally in the embodiments of the present disclosure. For example, "firmly connect," "detachably connect," and "integrally connect" are all possible. It is also possible that "mechanically connect," "electrically connect," and "mutually communicate" are used. It is also possible that "directly couple," "indirectly couple via a medium," and "two components mutually interact" are used.

Embodiment 1

Figure 4:
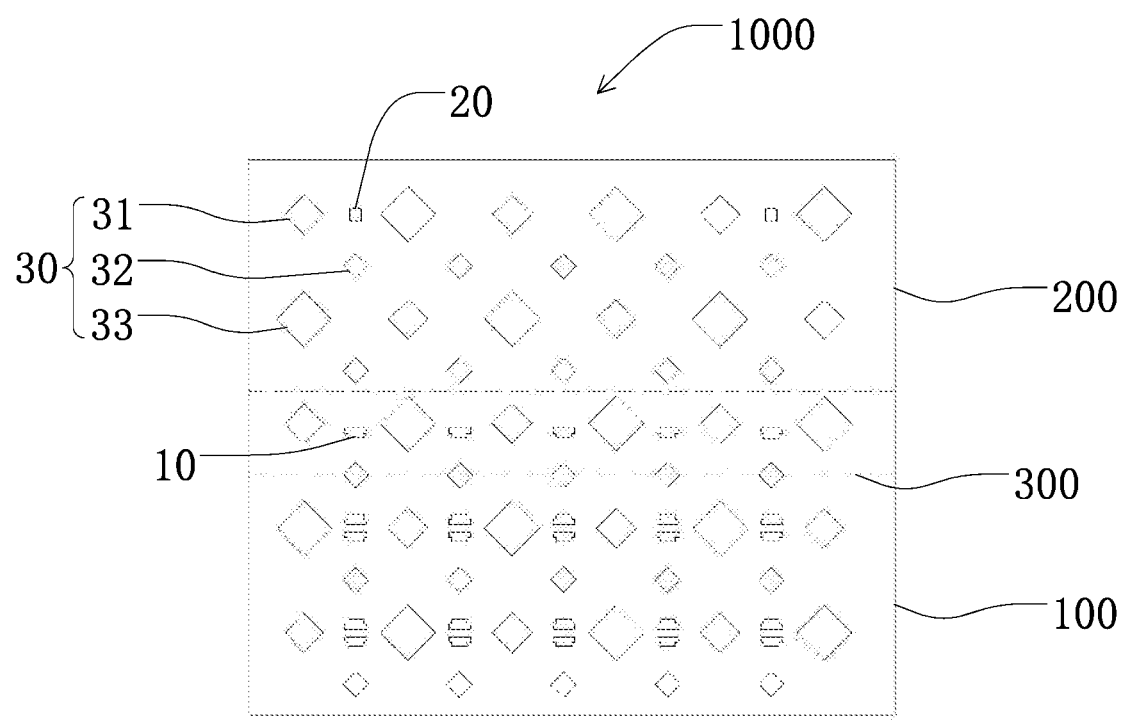
FIG. 4 illustrates spacers distributed on an array substrate according to an embodiment of the present disclosure.

As illustrated in FIG. 4, an array substrate 1000 is proposed by a first embodiment of the present disclosure. The array substrate 1000 includes a bending area 100 and a non-bending area 200. The bending area 100 is connected to the non-bending area 200. A bending centerline 300 is disposed on the bending area 100. When the array substrate 1000 is arranged flat, the width of the bending area 100 is $2\pi$ times the bending radius. In another embodiment, the width of a bending area 100 is 20 millimeters (mm), which is not specifically limited. Those skilled in the art can decide in reality.

The array substrate 1000 further includes a plurality of subpixels 30, a plurality of first spacers 10, and a plurality of second spacers 20.

The array of subpixels 30 is distributed over a bending area 100 and a non-bending area 200. The subpixel 30 includes a red subpixel 31, a blue subpixel 32, and a green subpixel 33. The red subpixel 30 and the blue subpixel 32 are arranged in a plurality of columns at intervals. The red subpixel 31 and the blue subpixel 32 are equally spaced apart from each other. The green subpixels 33 are arranged in a plurality of columns and correspond to each other. The center line of each of the red subpixels 31 and the adjacent blue subpixels 32 includes a vertical bisector. The center of a green subpixel 33 is on the vertical bisector. The subpixels 30 are evenly distributed to make the color of the pixel structure display more uniformly.

The first spacer 10 is disposed on the bending area 100 in a direction perpendicular to the bending center line 300. One of the first spacers 10 is disposed on both sides of each of the green subpixels 33. The first spacer 10 is further arranged between one of the red subpixels 31 and one of the blue subpixels 32. In the embodiment of the present disclosure, the first spacer 10 is shaped like a valley and includes one of the first spacers 10 and one of the second spacers 20. The height of the first spacer 10 is less than the height of the second spacer. The first spacer 10 faces the green subpixel 33 corresponding thereto.

The second spacer 20 is disposed on the non-bending area 200. A second spacer 20 is disposed between every eight of the subpixels 30 and is arranged between one of the red subpixels 31 and one of the blue subpixels 32. The second spacer 20 is trapezoidal. One side of the second spacer 20 which is connected to the non-bending area 200 is greater than the top surface of second spacer 20.

The first spacer 10 and the second spacer 20 both are made of organic photoresists. The first spacer 10 and the second spacer 20 may be formed in a half-tone process or in a photolithography process. In another embodiment, the thickness of a first spacer 10 and the thickness of a second spacer 20 each are 1.5 micrometers (um). However, it is not specifically limited so those skilled in the art can make a decision according to actual needs.

Figure 5:
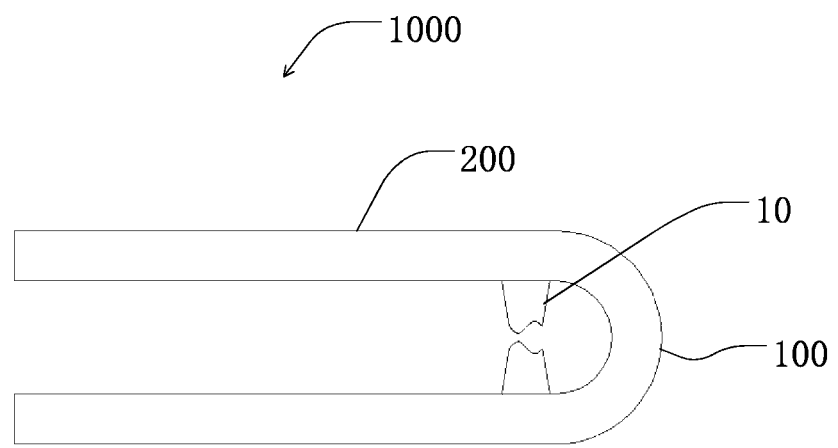
FIG. 5 illustrates a bent array substrate according to a first embodiment of the present disclosure.

As illustrated in FIG. 5, the spacers in the bending area 100 correspond to each other when the array substrate 1000 is bent. So the stress on both sides of the subpixel 30 in the bending area 100 can be uniformly distributed. In addition, the subpixel 30 is comprehensively strengthened to withstand stress in the bending process.

Further, a flexible display panel is proposed in another embodiment of the present disclosure. The flexible display panel includes the array substrate 1000. The array substrate 1000 may be applied to electronic display devices such as cellphones, displays, televisions, notebook computers, tablet computers, wearable display devices, vehicle display devices, augmented reality (AR), virtual reality (VR), etc.

In the first embodiment of the present disclosure, when the array substrate 1000 is bent, the stress produced when the film layers of the device are dynamically bent can be evenly distributed by adding spacers in the bending area 100 and by increasing the distribution density of the spacers. In this way, the devices in the array substrate 1000 can be better protected. The stress distribution unevenness of the subpixels 30 in the related art is effectively avoided. The ability of the subpixels 30 in the bending area 100 to withstand stress during the bending process is enhanced. The service life of the array substrate 1000 is prolonged. The reliability of the display device is ensured. Overall, the requirement for the reliability of the product is fulfilled. Moreover, no additional masks are needed in the embodiment of the present disclosure as long as the spacer mask of the related art is redesigned, which saves resources and reduces costs obviously.

Embodiment 2

As illustrated in FIG. 4, an array substrate 1000 is proposed by a second embodiment of the present disclosure. The array substrate 1000 includes a bending area 100 and a non-bending area 200. The bending area 100 is connected to the non-bending area 200. A bending centerline 300 is disposed on the bending area 100. When the array substrate 1000 is arranged flat, the width of the bending area 100 is $2\pi$ times the bending radius. In another embodiment, the width of a bending area 100 is 20 millimeters (mm), but is not specifically limited. Those skilled in the art can decide according to actual needs.

Further, the array substrate 1000 includes a plurality of subpixels 30, a plurality of first spacers 10, and a plurality of second spacers 20.

The array of subpixels 30 is distributed over a bending area 100 and a non-bending area 200. The subpixel 30 includes a red subpixel 31, a blue subpixel 32, and a green subpixel 33. The red subpixel 30 and the blue subpixel 32 are arranged in a plurality of columns at intervals. The red subpixel 31 and the blue subpixel 32 are equally spaced apart from each other. The green subpixels 33 are arranged in a plurality of columns and correspond to each other. The center line of each of the red subpixels 31 and the adjacent blue subpixels 32 includes a vertical bisector. The center of a green subpixel 33 is on the vertical bisector. The subpixels 30 are evenly distributed to make the color of the pixel structure display more uniformly.

The first spacer 10 is disposed on the bending area 100 in a direction perpendicular to the bending center line 300. One of the first spacers 10 is disposed on both sides of each of the green subpixels 33. The first spacer 10 is further arranged between one of the red subpixels 31 and one of the blue subpixels 32. In the present embodiment of the present disclosure, the first spacer 10 is shaped like a step and includes one of the first spacers 10 and one of the second spacers 20. The height of the first spacer 10 is less than the height of the second spacer 20. The first spacer 10 faces the green subpixel 33 corresponding thereto.

The second spacer 20 is disposed on the non-bending area 200. A second spacer 20 is disposed between every eight of the subpixels 30 and is arranged between one of the red subpixels 31 and one of the blue subpixels 32. The second spacer 20 is trapezoidal. One side of the second spacer 20 which is connected to the non-bending area 200 is greater than the top surface of second spacer 20.

The first spacer 10 and the second spacer 20 both are made of organic photoresists. The first spacer 10 and the second spacer 20 may be formed in a half-tone process or in a photolithography process. In another embodiment, the thickness of a first spacer 10 and the thickness of a second spacer 20 both are 1.5 micrometers (um). However, the thickness is not specifically limited so those skilled in the art can make a decision according to actual needs.

Figure 6:
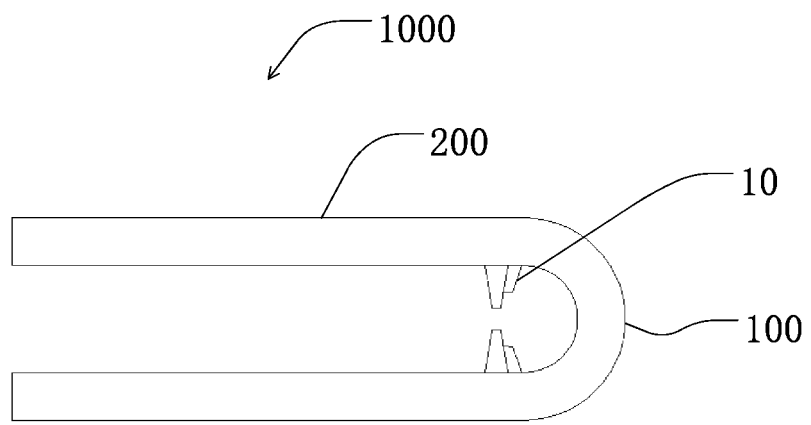
FIG. 6 illustrates a bent array substrate according to a second embodiment of the present disclosure.

As illustrated in FIG. 6, the spacers in the bending area 100 correspond to each other when the array substrate 1000 is bent. So the stress on both sides of the subpixel 30 in the bending area 100 can be uniformly distributed. In addition, the subpixel 30 is comprehensively strengthened to withstand stress in the bending process.

The present disclosure further proposes a flexible display panel in another embodiment. The flexible display panel includes an array substrate 1000 which may be applied to electronic display devices such as cellphones, displays, televisions, notebook computers, tablet computers, wearable display devices, vehicle display devices, augmented reality (AR), virtual reality (VR), etc.

In the second embodiment of the present disclosure, when the array substrate 1000 is bent, the stress produced while the film layers of the device are dynamically bent can be evenly distributed by adding spacers in the bending area 100 and by increasing the distribution density of the spacers. In this way, the devices in the array substrate 1000 can be better protected. The stress distribution unevenness of the subpixels 30 in the related art is effectively avoided. The ability of the subpixels 30 in the bending area 100 to withstand stress during the bending process is enhanced. The service life of the array substrate 1000 is prolonged. The reliability of the display device is ensured. Overall, the requirement for the reliability of the product is fulfilled. Moreover, no additional masks are needed in the embodiment of the present disclosure as long as the spacer mask of the related art is redesigned, which saves resources and reduces costs obviously.

The present disclosure is described in detail in accordance with the above contents with the specific preferred examples. However, this present disclosure is not limited to the specific examples. For the ordinary technical personnel of the technical field of the present disclosure, on the premise of keeping the conception of the present disclosure, the technical personnel can also make simple deductions or replacements, and all of which should be considered to belong to the protection scope of the present disclosure.

What is claimed is:

1. An array substrate, comprising:
    a non-bending area and a bending area connecting the non-bending areas;
    a subpixel, distributed in arrays in the non-bending area and the bending area;
    a plurality of first spacers disposed on the bending area, and the first spacers correspondingly distributed on both sides of each of the subpixels, wherein each of the first spacers is shaped like a step or a valley; and
    a plurality of second spacers disposed on the non-bending area,
    wherein the first spacers and the second spacers are configured to evenly distribute the stress produced while the array substrate is dynamically bent,
    wherein a bending centerline is disposed on the bending area; ore or more of the first spacers are disposed on both sides of each of the subpixels in a direction perpendicular to the bending center line, and
    wherein the first spacer comprises a first subspacer and a second subspacer, the height of the first subspacer is less than the height of the second subspacer, and the first subspacer faces the subpixel corresponding thereto.

2. The array substrate of claim 1, wherein the width of the bending area is 2π times the bending radius when the array substrate is arranged flat.

3. The array substrate of claim 1, wherein one of the second spacers is disposed between every eight of the subpixels in the non-bending area.

4. The array substrate of claim 1, wherein material for the first spacer and the second spacer is an organic photoresist.

5. The array substrate of claim 1, wherein the subpixels comprise red subpixels, blue subpixels, and green subpixels; the green subpixels are correspondingly arranged in a plurality of columns; the red subpixels and the blue subpixels are correspondingly arranged in a plurality of columns at intervals.

6. The array substrate of claim 5, wherein a center line of each of the red subpixels and the adjacent blue subpixel comprises a vertical bisector; the center of one of the green subpixels is on the vertical bisector.

7. The array substrate of claim 6, wherein the first spacer is arranged between one of the red subpixels and one of the blue subpixels.

8. A flexible display panel comprising an array substrate, the array substrate, comprising:
    a non-bending area and a bending area connecting the non-bending areas;
    a subpixel, distributed in arrays in the non-bending area and the bending area;
    a plurality of first spacers disposed on the bending area, and the first spacers correspondingly distributed on both sides of each of the subpixels, wherein each of the first spacers is shaped like a step or a valley; and
    a plurality of second spacers disposed on the non-bending area,
    wherein the first spacers and the second spacers are configured to evenly distribute the stress produced when the array substrate is bent,
    wherein a bending centerline is disposed on the bending area; ore or more of the first spacers are disposed on both sides of each of the subpixels in a direction perpendicular to the bending center line, and
    wherein the first spacer comprises a first subspacer and a second subspacer, the height of the first subspacer is less than the height of the second subspacer, and the first subspacer faces the subpixel corresponding thereto.

* * * * *